United States Patent [19]
Aoki

[11] Patent Number: 5,610,544
[45] Date of Patent: Mar. 11, 1997

[54] SEMICONDUCTOR INTEGRATED CIRCUIT FREE FROM THROUGH CURRENT DUE TO SOURCE-VOLTAGE DROP

[75] Inventor: Akihide Aoki, Itami, Japan

[73] Assignees: Mitsubishi Denki Kabushiki Kaisha, Tokyo; Mitsubishi Electric Semiconductor Software Corporation, Hyogo, both of Japan

[21] Appl. No.: 575,266

[22] Filed: Dec. 20, 1995

Related U.S. Application Data

[63] Continuation of Ser. No. 293,267, Aug. 19, 1994, abandoned.

[30] Foreign Application Priority Data

Oct. 29, 1993 [JP] Japan ................................ 5-271955

[51] Int. Cl.$^6$ ............................ H03K 17/24; H03K 17/16
[52] U.S. Cl. ........................... 327/198; 327/384; 365/226; 365/189.11
[58] Field of Search .................................... 327/526, 538, 327/142, 143, 198, 379, 383, 384, 389, 391; 365/229, 226, 189.11; 326/80, 81

[56] References Cited

U.S. PATENT DOCUMENTS

| | | | |
|---|---|---|---|
| 4,914,316 | 4/1990 | Rossi et al. | 327/538 |
| 5,241,508 | 8/1993 | Berenguel et al. | 365/229 |
| 5,291,454 | 3/1994 | Yamasaki et al. | 365/226 |
| 5,384,747 | 1/1995 | Clohset | 365/226 |
| 5,396,113 | 3/1995 | Park et al. | 327/538 |
| 5,497,112 | 3/1996 | Hoang | 327/143 |

FOREIGN PATENT DOCUMENTS

| | | | |
|---|---|---|---|
| 4101143 | 1/1991 | Germany | H03K 19/0175 |
| 3-46268 | 2/1991 | Japan . | |
| 3-185921 | 8/1991 | Japan . | |

*Primary Examiner*—Timothy P. Callahan
*Assistant Examiner*—Terry L. Englund
*Attorney, Agent, or Firm*—Lowe, Price, LeBlanc & Becker

[57] ABSTRACT

A semiconductor integrated circuit includes a first power system element group having an internal circuit for providing an output signal, and a second power system element group for receiving the output signal. An independently activated and deactivated power source potential is supplied to each of the first and second power system groups. In one embodiment of the invention, a fixing circuit maintains the level of the output signal from the internal circuit when the power source input potential to the first group is lowered or turned off. As a result, through currents in the nature of transitional large currents are reduced in the internal circuit elements of the second group.

14 Claims, 12 Drawing Sheets

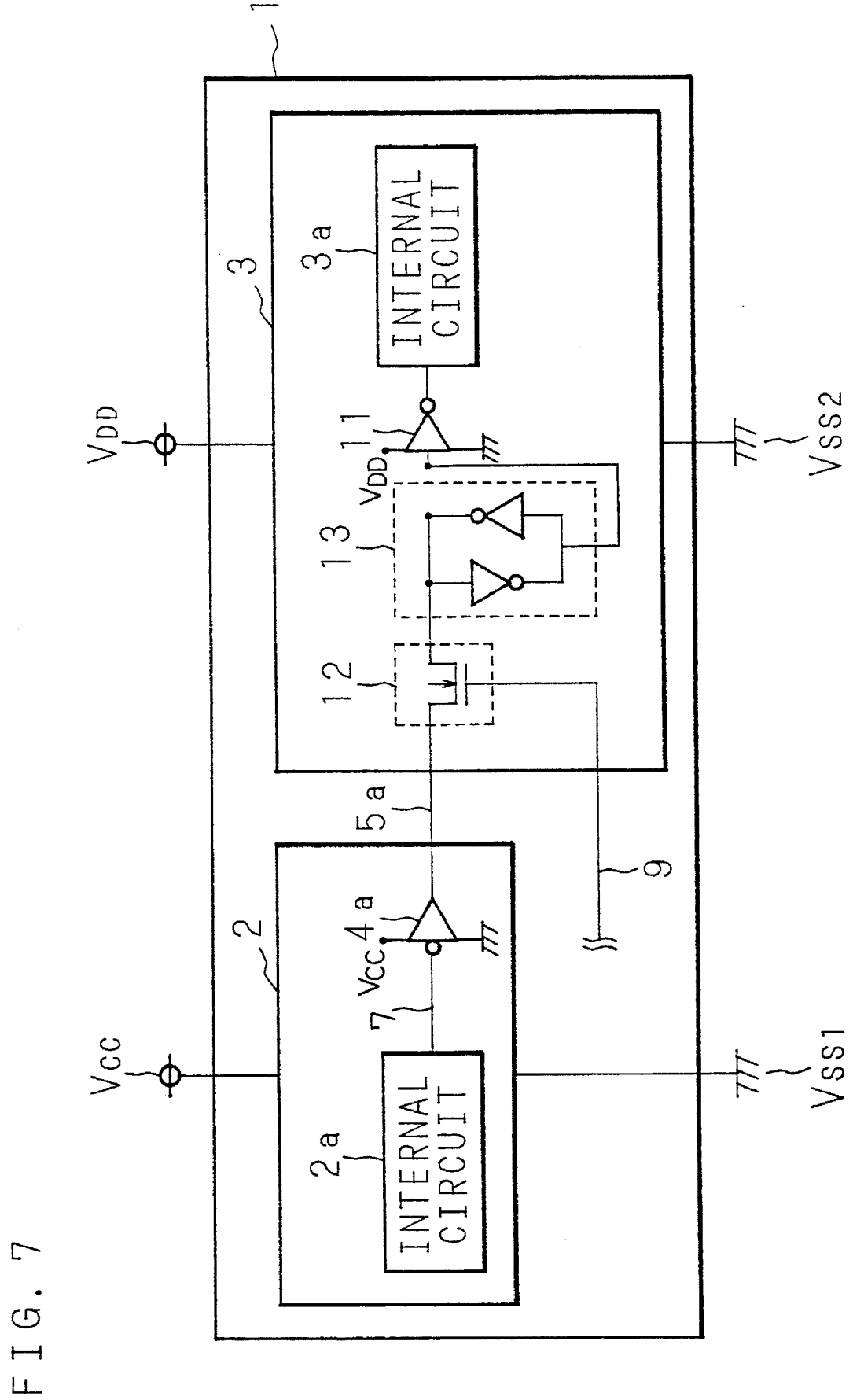

SEMICONDUCTOR INTEGRATED CIRCUIT FREE FROM THROUGH CURRENT DUE TO SOURCE-VOLTAGE DROP

This application is a continuation of application Ser. No. 08/293,267 filed Aug. 19, 1994 now abandoned.

BACKGROUND OF THE INVENTION

1. Field of the Invention

The present invention relates to a semiconductor integrated circuit having a plurality of circuits to which a power source potential is supplied independently.

2. Description of Related Art

FIG. 1 is a schematic view showing a structure of a conventional semiconductor integrated circuit using a plurality of power sources. Although FIG. 1 shows the structure using two power source systems, the same structure applies to a circuit with three or more power source systems. In FIG. 1, numeral 1 indicates semiconductor device including an element group (will be referred to as a first power system element group hereinafter) 2, which is connected between a first power source $V_{CC}$ and a ground $V_{SS1}$, and an element group (will be referred to as a second power system element group hereinafter) 3, which is connected between a second power source $V_{DD}$ and a ground $V_{SS2}$. The first power system element group 2 includes a plurality of output interfaces 4a, 4b, 4c . . . , which output signals 5a, 5b, 5c . . . to input interfaces 6a, 6b, 6c . . . included in the second power system element group 3 respectively.

In some cases, the semiconductor integrated circuit using a plurality of power sources as described above may operate in such a manner that the power from one of the power sources is cut off while the element group connected to the other power source is operated. This operation is carried out, for example, in the following case. The second power system element group 3 is formed of volatile memories such as RAM, and the first power system element group 2 is formed of functions elements other than those of the second power system element group 3, such as a CPU, ROM, a timer and an A/D converter. Usually, the first power source $V_{CC}$ is turned off in order to achieve lower power consumption when carrying out the back-up for the purpose of holding data in the volatile memories. In this operation, since the second power system element group 3 (e.g., RAM) which is connected to the second power source $V_{DD}$ functions as if it operates correctly even while the first power source $V_{CC}$ is turned off. This operation is referred to as a RAM backup function. In practice, however, such a phenomenon may occur that, when turning off the first power source $V_{CC}$, a through current flows through the second power system element group 3 (e.g., RAM), resulting in lowering of the potential of the second power source $V_{DD}$. This phenomenon will be described below.

FIG. 2 is a circuit diagram showing a specific example particularly related to the output interface 4a and the input interface 6a shown in FIG. 1. A signal 7 sent from a internal circuit 2a of the first power system element group 2 shown in FIG. 1 is fed to the output interface 4a formed of an inverter circuit of a negative logic, and is supplied therefrom, as an output signal 5a inverted and amplified by the output interface 4a, to the input interface 6a formed of an inverter circuit. The output interface 4a (and input interface 6a) may be formed of circuitry as shown in FIG. 3. A p-channel FET (Field Effect Transistor) 41 (61) and an n-channel FET 42 (62) are connected in this order between the first power source $V_{CC}$ (second power source $V_{DD}$) and the ground $V_{SS1}$ ($V_{SS2}$). The output signal 5a is outputted from the connection between the p-channel FET 41 and the n-channel FET 42 of the output interface 4a, and the p-channel FET 61 and the n-channel FET 62 of the input interface 6a receive the output signal 5a on their gates.

Now, a description will be made on an operation for a transitional period during which the first power source $V_{CC}$ is turned off or the level of the potential is lowered in the semiconductor integrated circuit having the structure shown in FIGS. 2 and 3. FIG. 4 is a timing chart showing the change of each potential and current when the first power source $V_{CC}$ is turned off. Before turning off the first power source $V_{CC}$, the signal 7 shown in FIG. 2 is "L". When the signal 7 is "L", the p-channel FET 41 shown in FIG. 3 is ON and the n-channel FET 42 is OFF. Thereby, the output signal a which substantially reflects the potential of the first power source $V_{CC}$ is "H". When the first power source $V_{CC}$ is turned off, the potential of the output signal 5a gradually changes from "H" into "L" in accordance with the lowering of the potential of the first power source $V_{CC}$. The operation at this time is carried out very slowly as compared with the ordinary switching operation.

In the case where the output signal 5a of an intermediate potential formed during a lowering of the potential is supplied to the input interface 6a, the p-channel FET 61 and the n-channel FET 62 become conductive, so that a so-called through current flows. In addition, since the output signal 5a changes slowly as described above, a through current, which is larger than a through current in the ordinary switching operation, flows through the input interface 6a. Thereby, the potential of the second power source $V_{DD}$ temporarily lowers (instantaneous lowering). This phenomenon is caused also at the time of lowering of a potential other than the time of turning off of the first power source $V_{CC}$.

In a conventional semiconductor integrated circuit in which a large through current flows when the first power source $V_{CC}$ is turned off or the potential lowers as described above, the semiconductor integrated circuit may malfunction due to the instantaneous lowering of the voltage of the second power source $V_{DD}$. In order to prevent this disadvantage, it is required, for example, to provide a power source which is remarkably strengthened so that influence upon the output of the second power source $V_{DD}$ can be suppressed even though a large current (through current) flows to the second power system element group 3.

As a prior art in which a through current does not flow to the second power system element group 3, Japanese Patent Application Laid-Open No. 3-46268 (1991) has disclosed a CMOS input buffer circuit (input interface 6a). In the CMOS input buffer circuit, an n-channel transistor for control is connected in series to the first transistor (61) and the second transistor (62), a p-channel transistor for control is connected in parallel to the first transistor (61), and these transistors for control are turned off in the battery backup mode. Further, Japanese Patent Application Laid-Open No. 3-185921 (1991) describes a semiconductor integrated circuit, in which a delay circuit formed of a plurality of FETs is placed preceding the output part (output interface 4a) so as to prevent the first and second switching units from turning on simultaneously.

SUMMARY OF THE INVENTION

The present invention has been developed in order to overcome the aforementioned problems, and it is one of the objects of the invention to provide a semiconductor integrated circuit which is constructed such that a level of a signal supplied from a first circuit to a second circuit is prevented from attaining a floating state. Thereby, even when the source potential to be supplied to the circuit lowers, lowering of the voltage, which may be caused by the flow of a through current through the second circuit is suppressed, attaining a stable operation of the second circuit.

A semiconductor integrated circuit according to the invention comprises fixing means such as an inverter, which is operable to fix a level of the signal, which is outputted from the first circuit to the second circuit at a predetermined level, when the supply of the power source potential to the first circuit is cut off. Accordingly, the cut off of the potential-supply to the first circuit does not cause such a state that the level of the signal, which is supplied from the first circuit to the second circuit attains a floating state in which a through current flows in the second circuit.

Another object of the invention is to provide a semiconductor integrated circuit, in which, when a level of a signal outputted from the first circuit to the second circuit attains a floating state, the signal is not supplied to an internal circuit of the second circuit, so that lowering of a voltage, which may be caused by the flow of a through current through the second circuit is suppressed even when the source potential to be supplied to the first circuit lowers, and thereby the second circuit can operate stably.

A semiconductor integrated circuit according to the invention comprises an operation means which uses, as input signals, a cut-off enable signal to indicate whether the supply power source potential to the first circuit can be cut off or not, as well as a signal to be supplied from the first circuit to the second circuit. For example, it comprises a detection circuit outputting a cut-off enable signal when detecting a power source potential to be supplied to the first circuit which will be cut off. The detection circuit may be constructed to supply the cut-off enable signal of "L" when said power source potential lowers, and the operation means may be an OR circuit receiving an inverted signal of the cut-off enable signal. The OR circuit supplies "H" unless both the received signals are "L". Accordingly, the output of the OR circuit is fixed at "H" even though the signal sent from the first circuit to the second circuit attains a floating state.

Further, the semiconductor integrated circuit according to the invention comprises a gate circuit provided in the second circuit to receive the signal sent from the first circuit to the second circuit, and a holding circuit to hold a signal supplied from the gate circuit. The gate circuit may be constructed such that it is controlled to open and close based on the power source potential to be supplied to the first circuit. Accordingly, the gate circuit closes when the the supply of the power source potential to the first circuit is cut, so that data already held by the holding circuit can be supplied to an internal circuit of the second circuit.

The opening and closing of said gate circuit is constructed to be controlled by a CPU based on the power source potential to be supplied to the first circuit. The CPU outputs a control signal for turning off the gate circuit when it receives a signal indicative of the cutoff of the power source potential-supply to the first circuit from the detection circuit provided external to the semiconductor integrated circuit. Such a structure may be employed that the supply of the power source potential to the first circuit is cut after the gate circuit is turned off by the control signal.

The above and further objects and features of the invention will more fully be apparent from the following detailed description with accompanying drawings.

BRIEF DESCRIPTION OF THE DRAWINGS

FIG. 7 is a circuit diagram showing still another structure of the semiconductor integrated circuit according to the invention;

DESCRIPTION OF THE PREFERRED EMBODIMENTS

Embodiments of the invention will be described below with reference to the drawings.

EMBODIMENT 1

Figure 3:
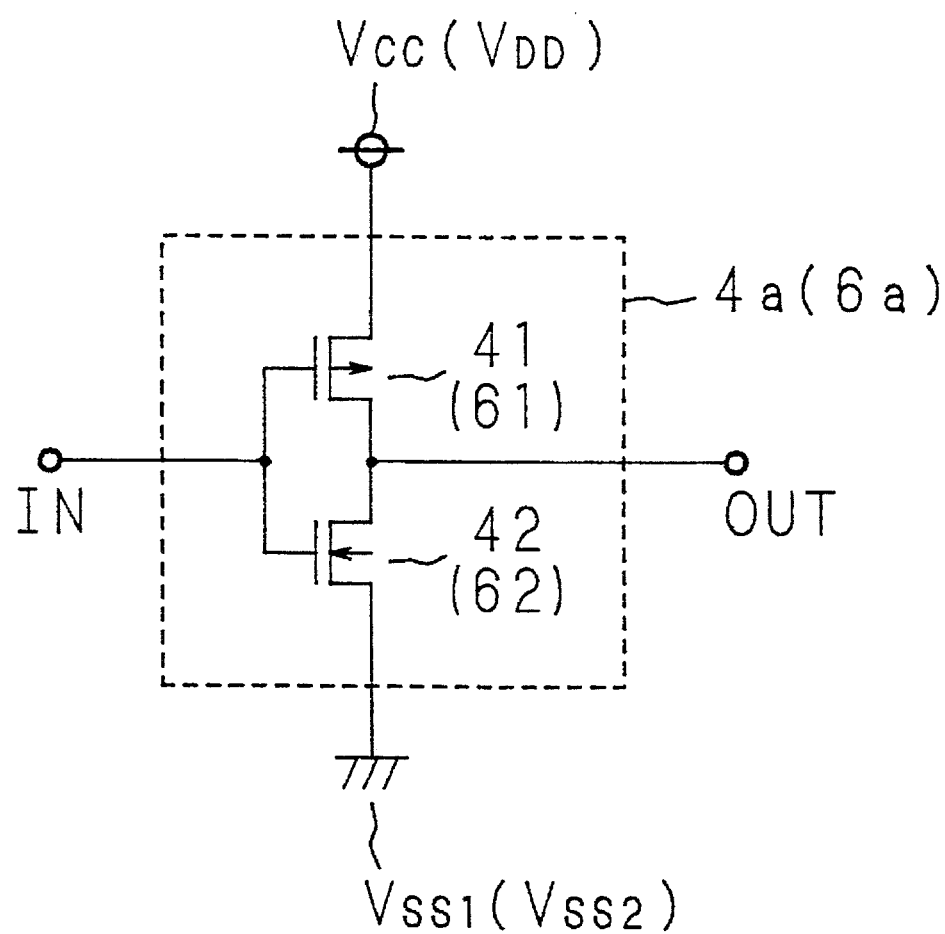
FIG. 3 is a circuit diagram showing an example of the structure of the output interface and input interface shown in FIG. 1.
Figure 4:
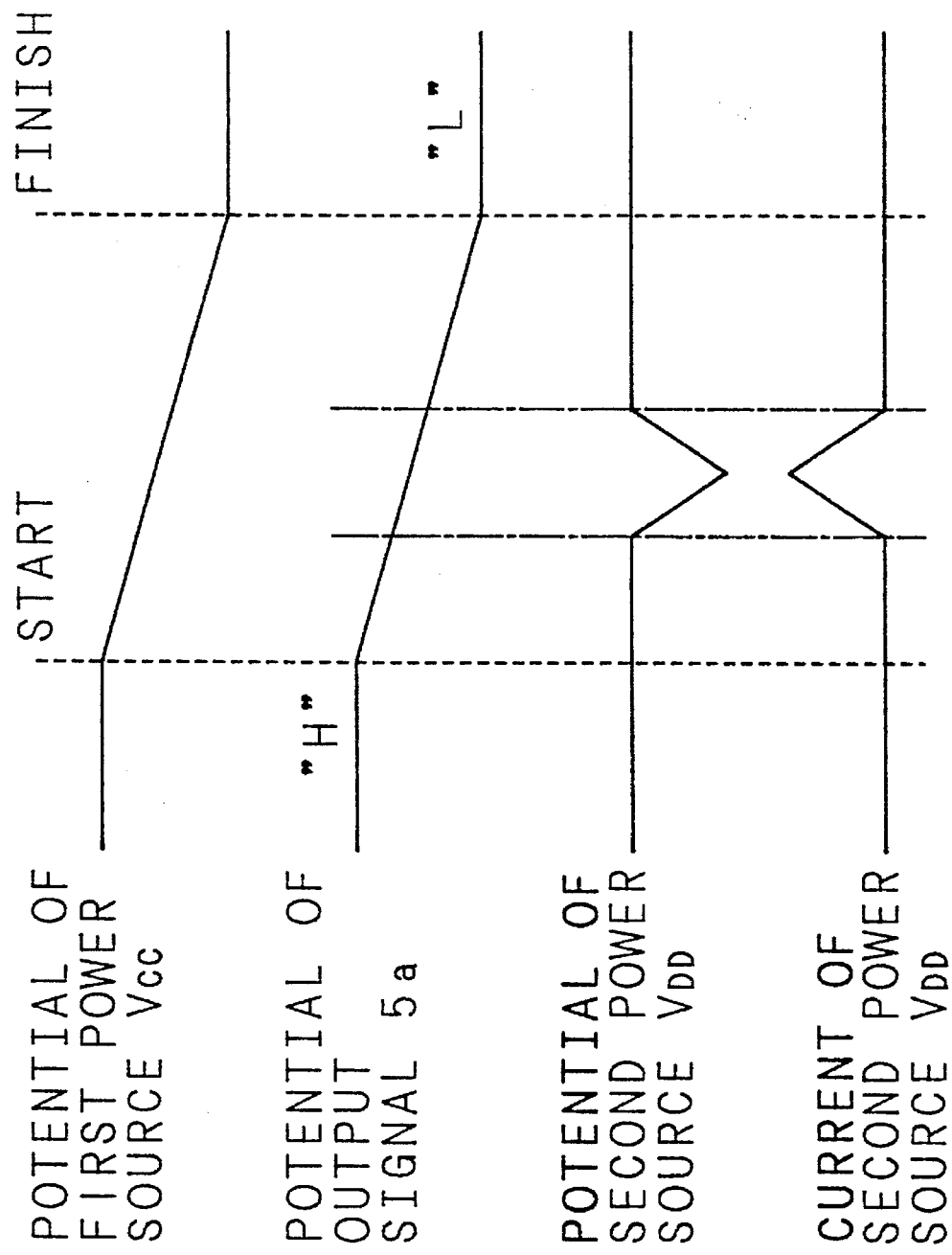
FIG. 4 is a timing chart showing the changes of potentials and current in the case where a current from the first power source is cut off.
Figure 5:
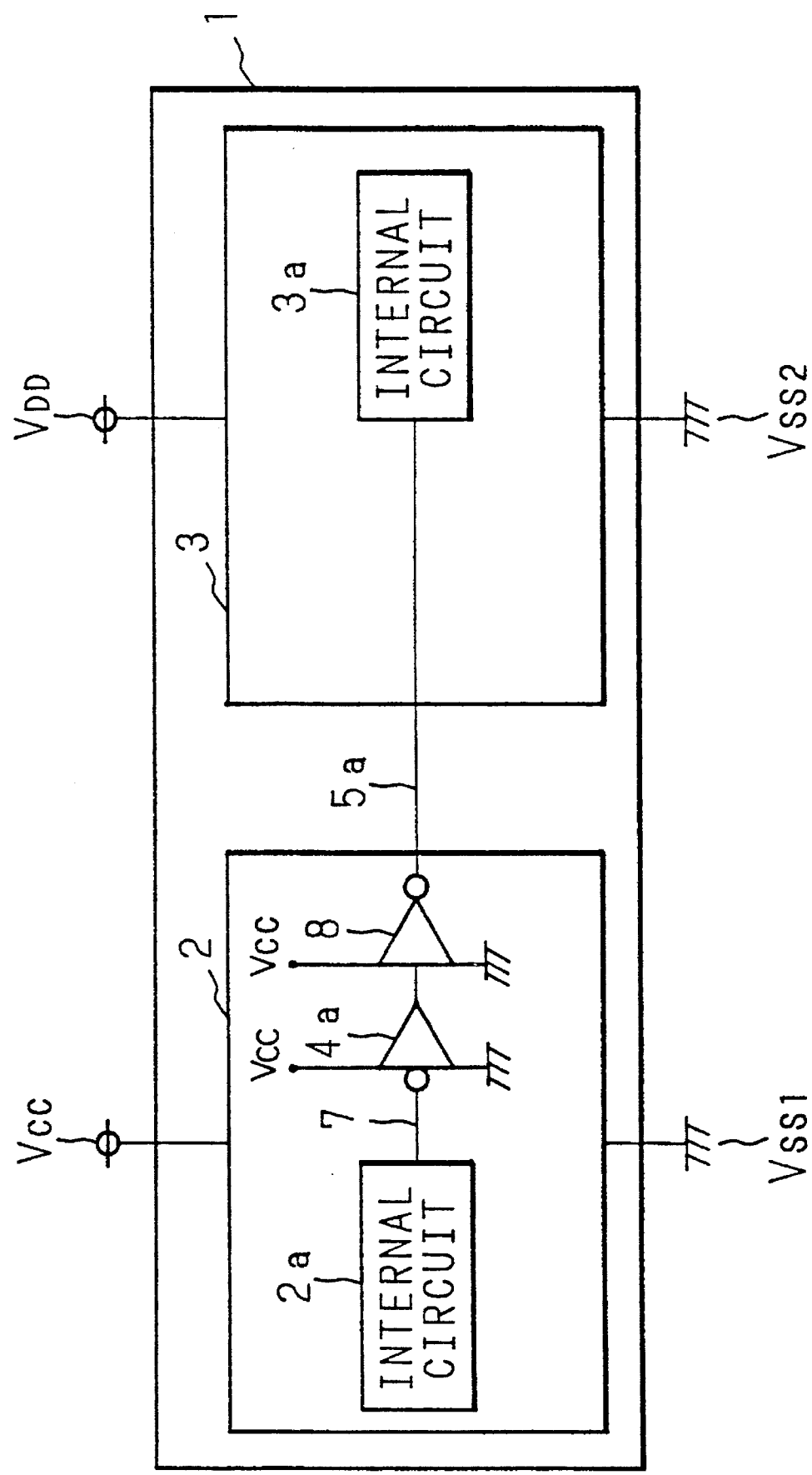
FIG. 5 is a circuit diagram showing the major structure of the semiconductor integrated circuit according to the invention.

FIG. 5 is a circuit diagram showing the major structure of a semiconductor integrated circuit according to the invention. A signal 7 supplied from an internal circuit 2a (e.g., CPU) of a first power system element group 2 connected to a first power source $V_{CC}$ is supplied to an output interface 4a formed of an inverter. The signal inverted and amplified by the output interface 4a is supplied to a gate 8 formed of an inverter. The signal sent through the gate 8 is supplied, as an output signal 5a of the first power system element group 2, to an internal circuit 3a (e.g., RAM) of a second power system element group 3 connected to a second power source $V_{DD}$. The structures of the output interface 4a and the gate 8 are the same as those shown in FIG. 3. Specifically, a p-channel FET and an n-channel FET are connected in this order between the first power source $V_{CC}$ and the ground $V_{SS1}$. The p-channel FET and the n-channel FET receive an input signal on their gates, and an output signal is supplied from the connection between the p-channel FET and the n-channel FET.

In the semiconductor integrated circuit thus constructed, it is assumed, similarly to the prior art, that the signal 7 is "L" before the cut off of the power from the first power source $V_{CC}$ (i.e., while the power is supplied therefrom.) In the backup mode for carrying out the backup of, e.g., RAM in the second power system element group 3, the first power source $V_{CC}$ is turned off so that its potential lowers. Before the first power source $V_{CC}$ is turned off, the signal 7 is "L", so that the p-channel FET of the output interface 4a is ON and the n-channel FET is OFF. Therefore, the output interface 4a outputs a potential of the first power source $V_{CC}$ to the gate 8. Thus, "H" is outputted. Thereby, the ground potential ($V_{SS1}$) is outputted as the output signal 5a from the gate 8.

The threshold voltage of gate 8 (CMOS inverter) Vth is expressed by the following equation.

$$Vth = \frac{\frac{Vth(n)}{Vcc} + \sqrt{\frac{\beta(p)}{\beta(n)}}\left(1 + \frac{|Vth(p)|}{Vcc}\right)}{1 + \sqrt{\frac{\beta(p)}{\beta(n)}}} \times Vcc$$

Accordingly, even though the first power source $V_{CC}$ is turned off thereafter and the potential of the first power source $V_{CC}$ lowers, the level of the output signal 5a, which changes in accordance with the lowering of the potential of the first power source $V_{CC}$ in the prior art, does not change and maintains "L". Thereby, a through current does not flow in the second power system element group 3.

Figure 1:
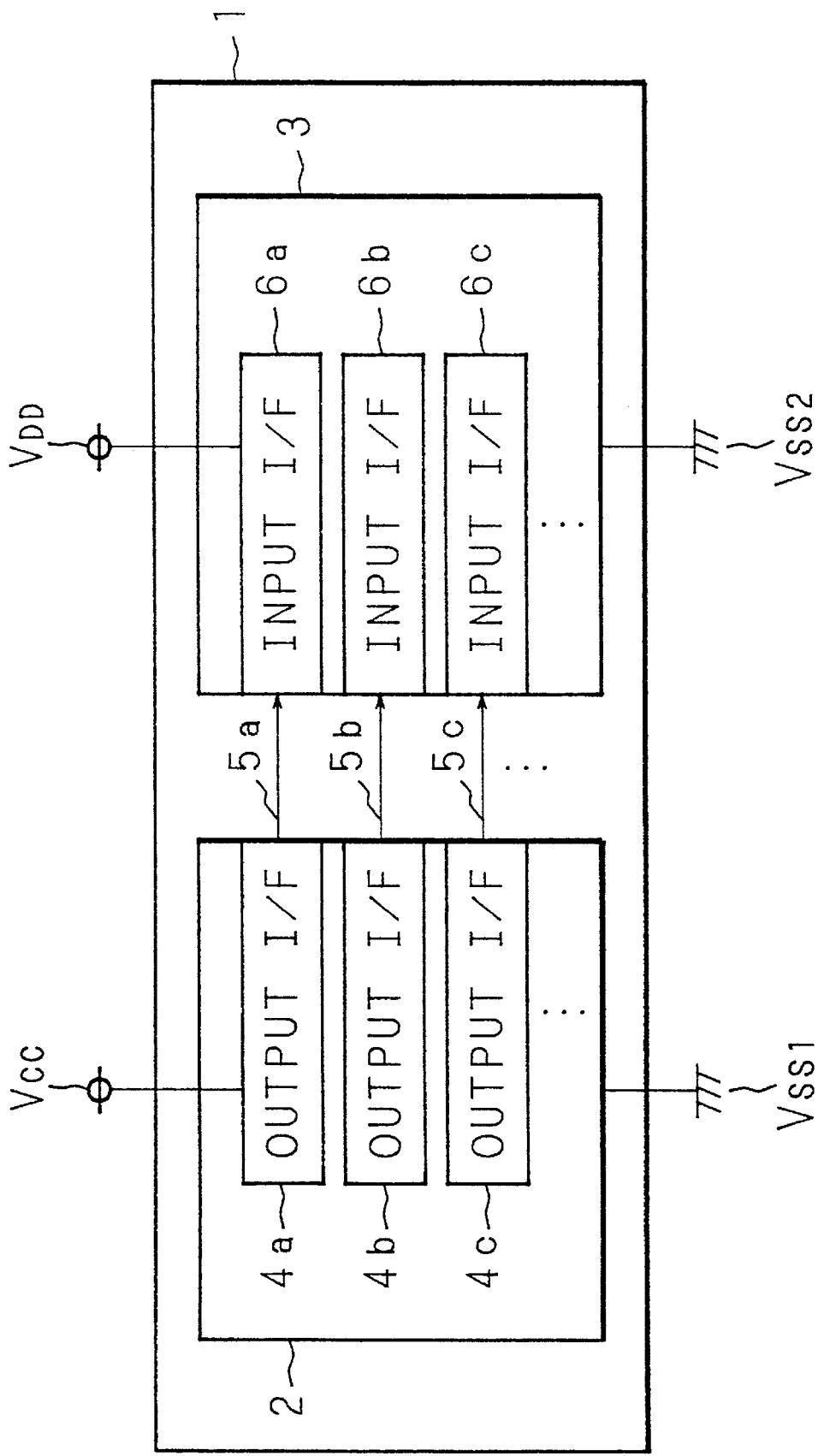
FIG. 1 is a schematic view showing the structure of a conventional semiconductor integrated circuit using a plurality of power sources.
Figure 2:
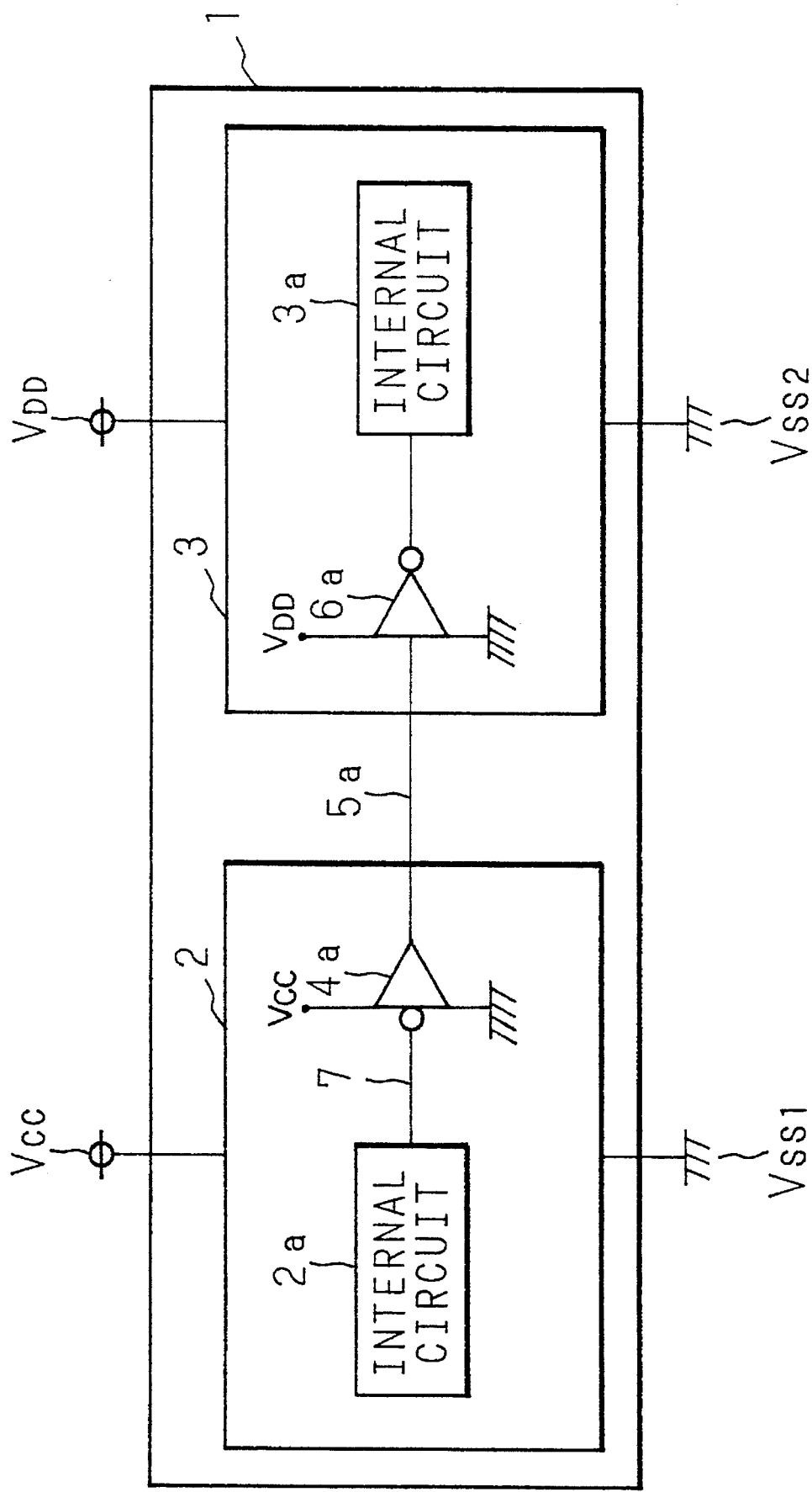
FIG. 2 is a circuit diagram showing a specific example related to an output interface and an input interface shown in FIG. 1.

The structure shown in FIG. 5 can be easily achieved by such a modification that the input interface 6a, which is connected to the second power source $V_{DD}$ in the structure shown in FIG. 2, is connected to the first power source $V_{CC}$ so that it can be used as the gate 8. Therefore, no additional new control signals and elements are required; all it takes is to change interconnections.

EMBODIMENT 2

Figure 6A:
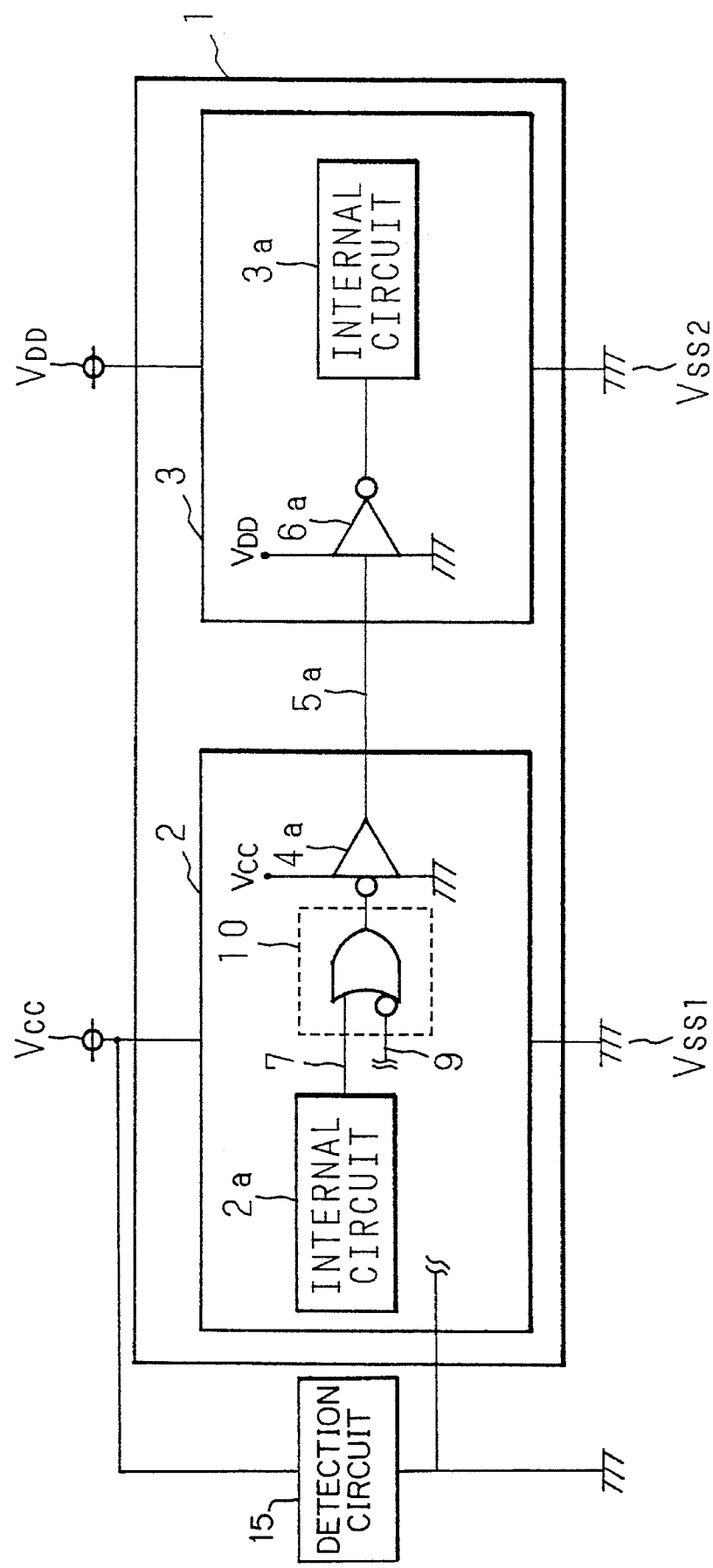
FIG. 6A is a circuit diagram showing another structure of the semiconductor integrated circuit according to the invention.

FIG. 6A is a circuit diagram showing another structure of a semiconductor integrated circuit according to the invention. This embodiment is provided with a control means 10 which is placed preceding the output interface 4a shown in FIG. 5. The control means 10 includes an OR circuit which receives, as input signals, the signal 7 and an inverted signal of the control signal 9. An output signal of the control means 10 is supplied to the output interface 4a, of which output signal is supplied, as the output signal 5a of the first power system element group 2, to the input interface 6a of the second power system element group 3. The control signal 9 indicates the detection of a lowering of the potential of the first power source $V_{CC}$ in response to an output signal of a detection circuit 15 detecting the output potential of the first power source $V_{CC}$. Said detection circuit 15 is provided externally but it may be provided internally in the second power system element group 3.

In any case, the control signal 9 is set to be "H" while the potential of the first power source $V_{CC}$ is "H", and to attain "L" when the potential of the first power source $V_{CC}$ lowers from "H". Therefore, when the power is on, the signal 7 is "L" and the control signal 9 is "H", so that the control means 10 supplies a signal of "L" to the output interface 4a. Therefore, the output signal 5a is "H".

When the first power source $V_{CC}$ is turned off, the control signal 9 attains "L" due to a lowering of the potential of the first power source $V_{CC}$. Thereby, the control means 10 supplies "H" regardless of the signal 7. Therefore, the output signal 5a changes into "L".

Thereby, the output signal 5a outputted from the output interface 4a changes from "H" to "L" simultaneously with the lowering of the potential of the first power source $V_{CC}$. This extremely reduces a time period, during which the signal of "H" in the floating state is outputted as the output signal 5a without being changed, as is done in the prior art. As described above, this embodiment is constructed such that the output signal 5a is always "L" while the potential of the first power source $V_{CC}$ is lowering. Thereby, it is possible to reduce the through current in the input interface 6a without changing the element structure of the second power system element group 3.

Figure 6B:
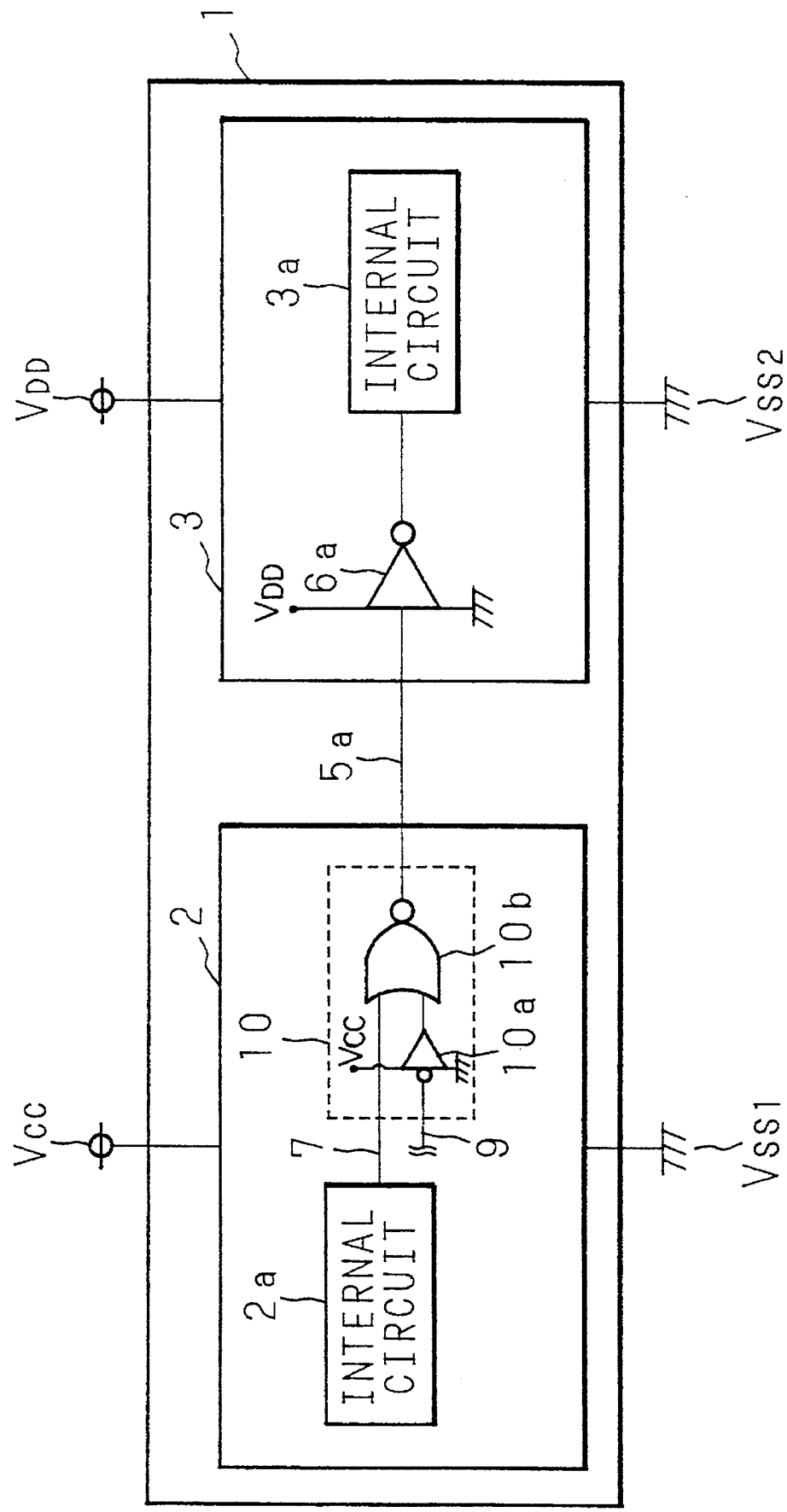
FIG. 6B is a circuit diagram showing modification of FIG. 6A.

FIG. 6B is a circuit diagram showing modification of FIG. 6A. The control means 10 includes an inverter circuit 10a which receives the control signal 9, and a NOR circuit 10b which receives the signal 7 and the output signal of the inverter circuit 10a. The output interface 4a shown in FIG. 6A is omitted. This constitution allows easier production than that shown in FIG. 6A. In this constitution the through current is similarly reduced.

EMBODIMENT 3

FIG. 7 is a circuit diagram showing still another structure of a semiconductor integrated circuit according to the invention. This embodiment is provided with transmission gate 12 formed of an n-channel FET, a latch circuit 13 formed of two inverter circuits and a inverter circuit 11 as the input interface of the second power system element group 3. The transmission gate 12 receives on its gate the control signal 9 similarly to the aforementioned embodiment, and also receives the output signal 5a on its terminal. An output signal of the transmission gate 12 is supplied to the internal circuit 3a via the latch circuit 13 and inverter circuit 11.

Since the control signal 9 is "H" while the first power source $V_{CC}$ is ON, the transmission gate 12 is ON. Therefore, the output signal 5a is supplied to an internal circuit 3a of the second power system element group 3 via the latch circuit 13. When the first power source $V_{CC}$ is turned off and the potential of the first power source $V_{CC}$ starts to lower, the control signal 9 attains "L", so that the transmission gate 12 is turned off. Thereby, the output signal 5a is not supplied to the latch circuit 13. At this time, the latch circuit 13 holds the output signal 5a which had been supplied thereto before the transmission gate 12 was turned off. Therefore, the output signal 5a in the floating state is not applied to the internal circuit 3a. Thereby, it is possible to prevent the flow of a large through current in the internal circuit 3a of the second power system element group 3.

EMBODIMENT 4

Figure 8:
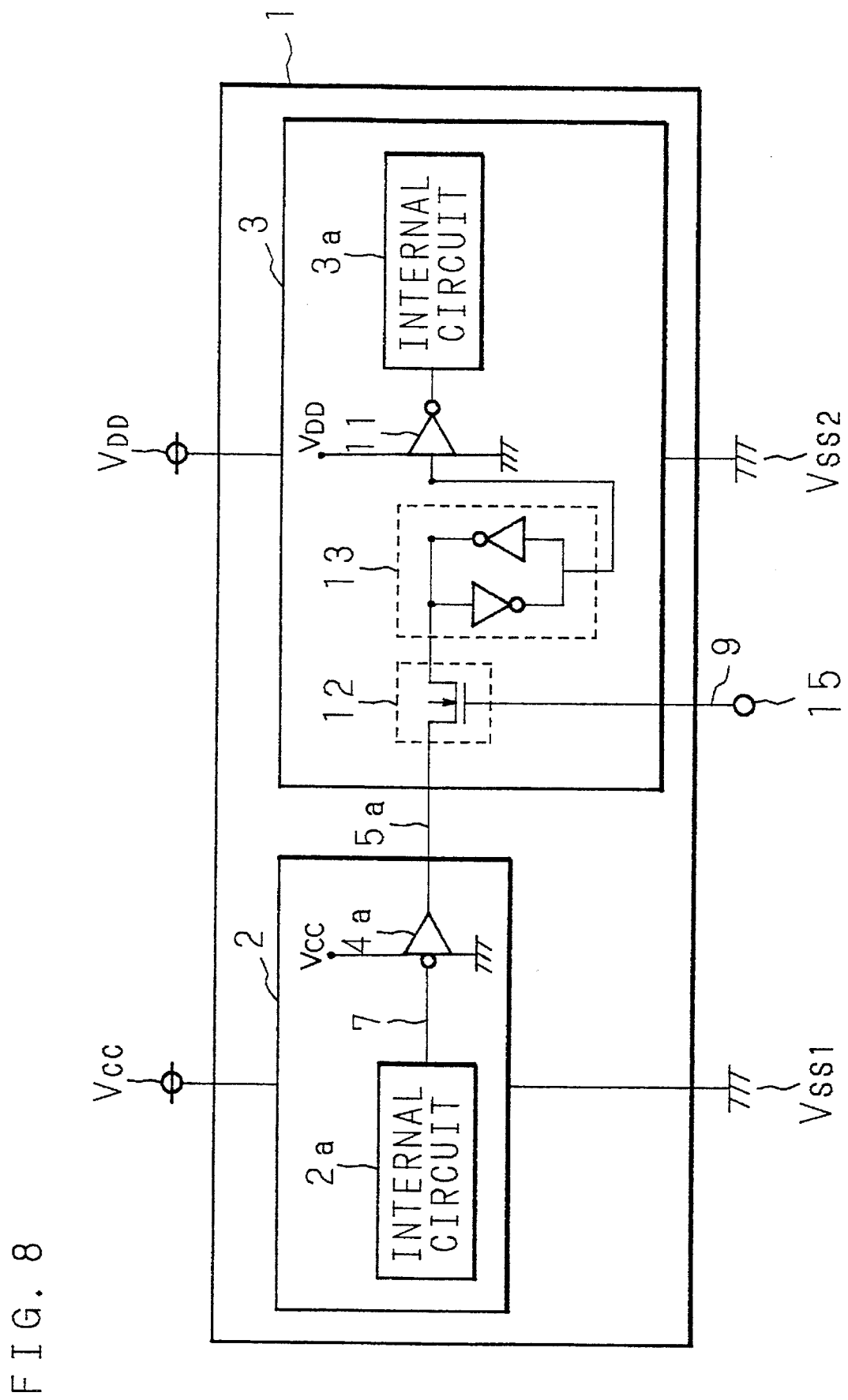
FIG. 8 is a circuit diagram showing yet another structure of the semiconductor integrated circuit according to the invention.

Such a structure may be employed that the control signal 9 in the embodiment 3 is supplied from an external terminal 15 as shown in FIG. 8, in which case a similar effect can be obtained. In this embodiment, it is not necessary to provide a control circuit in the semiconductor integrated circuit according to the invention, so that a simplified structure can be achieved with an additional signal line.

EMBODIMENT 5

Figure 9:
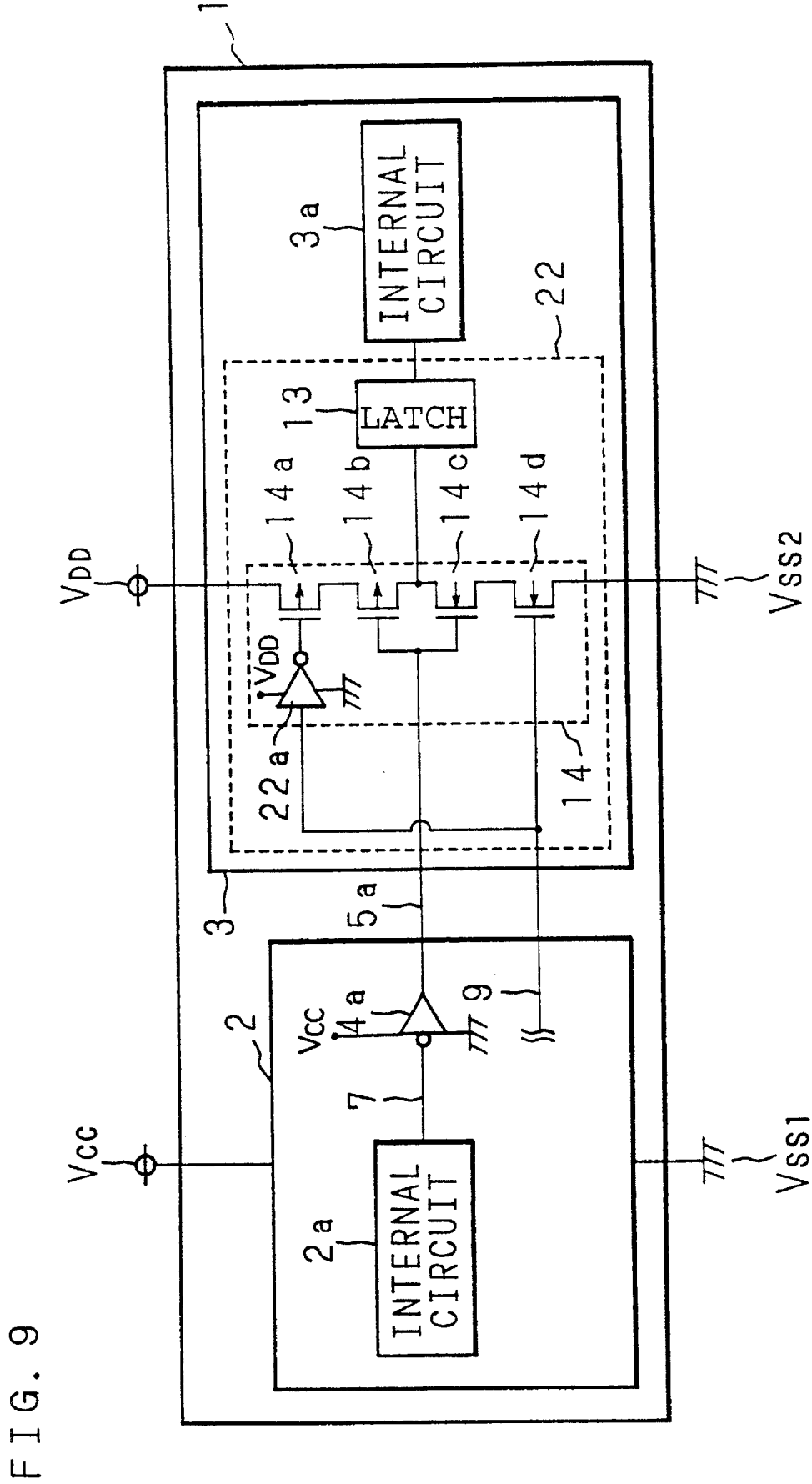
FIG. 9 is a circuit diagram showing further another structure of the semiconductor integrated circuit according to the invention.

FIG. 9 is a circuit diagram showing yet another structure of a semiconductor integrated circuit according to the invention. This embodiment is provided with a control means 22 as an input interface of the second power system element group 3. The control means 22 includes a clock gate circuit 14 and a latch circuit 13 connected together. The clock gate circuit 14 includes two p-channel FETs 14a and 14b and two n-channel FETs 14c and 14d connected in this order in series between the second power source $V_{DD}$ and the ground $V_{SS2}$. The p-channel FET 14a receives the control signal 9 on its gate via an inverter 22a. The n-channel FET 14d directly receives the control signal 9. The p-channel FET 14b and n-channel FET 14c have gates connected commonly and receive the output signal 5a.

Similar to the aforementioned embodiment, the control signal 9 is "H" while the first power source $V_{CC}$ is ON, and attains "L" when the potential of the first power source $V_{CC}$ starts to lower. While the first power source $V_{CC}$ is on, the output signal 5a is "H" when the internal circuit 2a of the first power system element group 2 outputs the signal 7 of "L". Therefore, the p-channel FET 14a is ON, the p-channel FET 14b is OFF, the n-channel FET 14c is ON, and the n-channel FET 14d is on. Accordingly, "L" is supplied to the latch circuit 13. Conversely, when the signal 7 is "H" during the aforementioned period, the output signal 5a is "L", and the signal of "H" is supplied to the latch circuit 13.

When the first power source $V_{CC}$ is turned off, the control signal 9 attains "L". Therefore, the p-channel FET 14a and the n-channel FET 14d are turned off, and the signal is not supplied to the latch circuit 13 regardless of the potential of the output signal 5a. At this time, the latch circuit 13 supplies the output signal already received from the clock gate circuit 14 to the internal circuit 3a of the second power system element group 3.

Thereby, a signal in the floating state is hardly supplied to the internal circuit 3a even though the first power source $V_{CC}$ is turned off, so that it is possible to prevent the flow of a large through current in the internal circuit 3a.

EMBODIMENT 6

Figure 10:
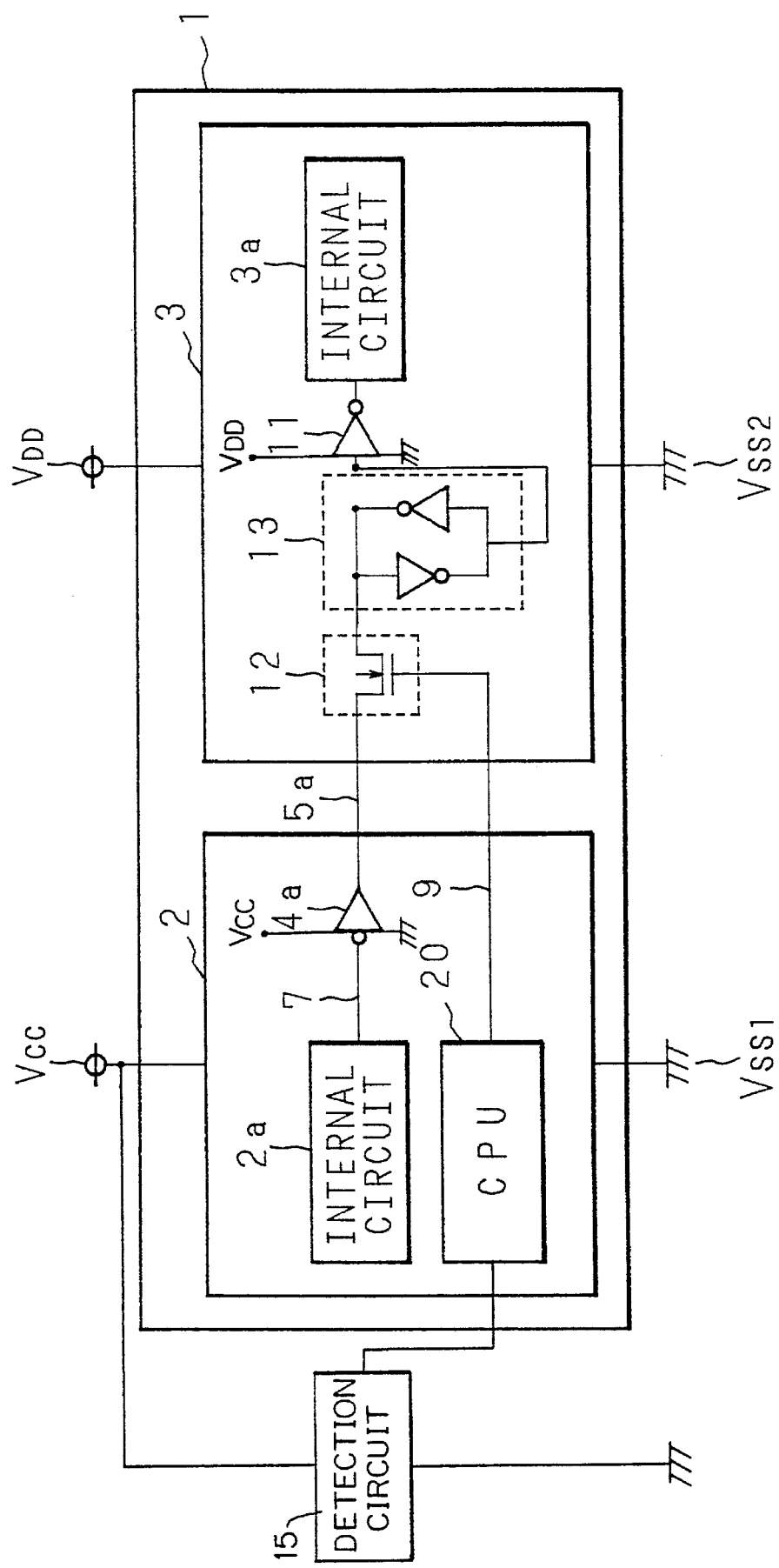
FIG. 10 is a circuit diagram showing still another structure of the semiconductor integrated circuit according to the invention.

FIG. 10 is also a circuit diagram showing another structure of a semiconductor integrated circuit according to the invention. In this embodiment, the structures of the first power system element group 2 and the second power system element group 3 are similar to those shown in FIG. 7, and a CPU 20 outputs a signal to be supplied to the gate of the transmission gate 12. The CPU 20 supplies the control signal 9 of "L" for turning off the transmission gate 12, when it receives the signal indicating that the first power source $V_{CC}$ is turned off from the detection circuit 15 provided external to the semiconductor integrated circuit. This embodiment can achieve a similar effect to the aforementioned embodiment. In this structure in which the control signal 9 is supplied from the CPU 20, such a structure may be employed that the first power source $V_{CC}$ is turned off after the control signal 9 turned off the transmission gate 12.

EMBODIMENT 7

Figure 11:
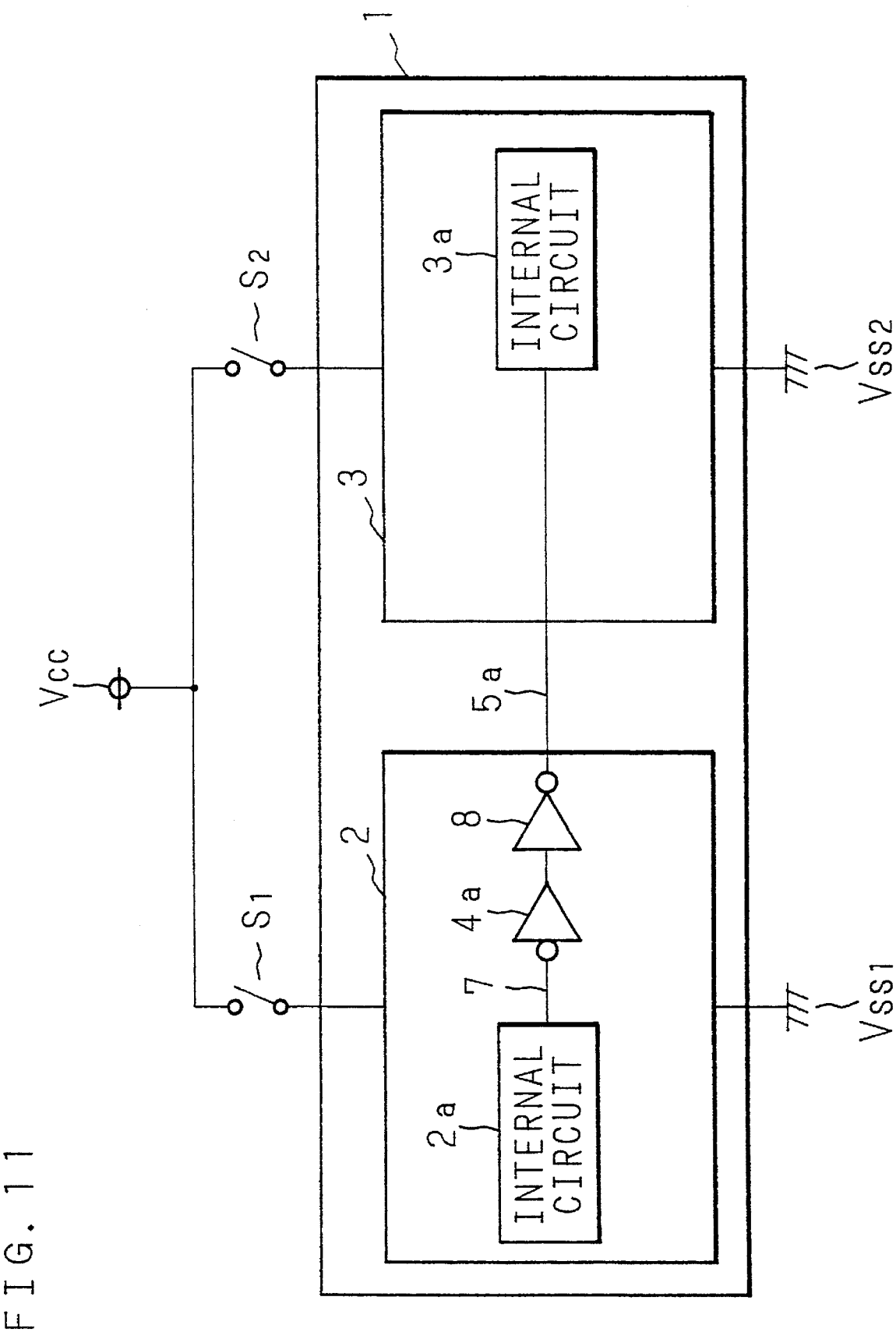
FIG. 11 is a circuit diagram showing still another structure of the semiconductor integrated circuit according to the invention.

FIG. 11 is a circuit diagram showing one more structure of a semiconductor integrated circuit according to the invention. In this embodiment, the first and second power system element groups 2 and 3 are connected to the common power source $V_{CC}$. A switch S1 is interposed between the power source $V_{CC}$ and the first power system element group 2. A switch S2 is interposed between the power source $V_{CC}$ and the second power system element group 3. These switches S1 and S2 can be individually controlled to open and close. Other structures, which are similar to those shown in FIG. 5, bear the same reference characters and their explanations are omitted. This embodiment can achieve a similar effect to that of the first embodiment.

In the embodiments 2 through 5, such a structure may be employed that the first and second power sources $V_{CC}$ and $V_{DD}$ are formed of the same power source and can be independently controlled to supply the source potential.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A semiconductor integrated circuit comprising:

a first terminal and a second terminal for respectively receiving first and second selectively applied power source potentials;

a first power system element group coupled to said first terminal, said first group having a first internal circuit for providing a first signal, a second power system element group coupled to said second terminal, said second group having at least one circuit element responsive to said first signal for changing between a first and a second operative state, wherein said at least one circuit element is susceptible to an undesirable through current which temporarily lowers the second power source potential when said first selectively applied power source potential is lowered or turned off; and means coupled between said first internal circuit of said first group and said at least one circuit element of said second group for minimizing said undesirable through currents in said at least one circuit element, wherein said means for minimizing undesirable through currents comprises:

a fixing means arranged in said first power system element group and coupled to said first terminal for fixing a low level of said signal supplied from said first internal circuit to said at least one internal circuit element before said first power source potential is lowered or turned off.

2. The semiconductor integrated circuit of claim 1, wherein said low level of said signal fixed by said fixing means is a ground level.

3. The semiconductor integrated circuit of claim 1, wherein said fixing means comprises an inverter circuit.

4. The semiconductor integrated circuit of claim 1, wherein the level of said first selectively applied power supply potential and said second selectively applied power supply potential are the same level.

5. A semiconductor circuit, comprising: a first terminal and a second terminal for respectively receiving first and second selectively applied power source potentials;

a first power system element group coupled to said first terminal, said first group having a first internal circuit for providing a first signal, a second power system element group coupled to said second terminal, said second group having at least one circuit element responsive to said first signal, for changing between a first and a second operative state wherein said at least one internal circuit element is susceptible to an undesirable through current which temporarily lowers the second power source potential when said first selectively applied power source potential is turned off; and means coupled between said first internal circuit of said first group and said at least one internal circuit element of said second group for minimizing said undesirable through currents in said at least one circuit element, wherein said means comprises:

control signal output means for supplying a control signal indicating whether or not said first power source potential is being lowered; and an operation means arranged in said first power system element group for receiving said first signal from said first internal circuit and said control signal from said control signal output means, for providing an output signal for reducing through currents in said at least one circuit element.

6. The semiconductor circuit of claim 5, wherein said control signal output means comprises:

a detection circuit coupled to said first input terminal for detecting the level of said first power source potential and for providing said control signal when the level of said first power source potential is lowered.

7. The semiconductor circuit of claim 6, wherein said operation means comprises:

an OR circuit responsive to an inverted control signal from said detection circuit.

8. The semiconductor circuit of claim 7, wherein said operation means further comprises an inverter having an input for receiving said control signal from said detection circuit and an output for providing said inverted control signal to said OR circuit.

9. A semiconductor circuit, comprising:

a first terminal and a second terminal for respectively receiving first and second selectively applied power source potentials;

a first power system element group coupled to said first terminal, said first group having a first internal circuit for providing a first signal, a second power system element group coupled to said second terminal, said second group having at least one internal circuit element responsive to said first signal for changing between a first and a second operative state, wherein said at least one internal circuit element is susceptible to an undesirable through current which temporarily lowers the second power source potential when said first selectively applied power source potential is lowered or turned off; and means arranged in said second power system element group and coupled between said first internal circuit of said first group and said at least one circuit element of said second group, for minimizing said undesirable through currents in said at least one circuit element, wherein said means for minimizing said undesirable through currents comprises:

a transmission gate circuit having a gate terminal responsive to a gate control signal, for transmitting a signal related to said first signal, and a latch circuit for holding said signal from said transmission gate circuit and for providing said signal to said at least one circuit element.

10. The semiconductor circuit of claim 9, further comprising:

a second means coupled to said first terminal and responsive to said first power source potential, for providing said gate control signal to said gate.

11. The semiconductor circuit of claim 10, wherein said second means coupled to said first terminal comprises:

a detection circuit for detecting the level of said first power source potential and for providing said gate control signal.

12. The semiconductor circuit of claim 9, further comprising:

a Central Processor Unit (CPU) arranged in said first power system element group for providing said gate control signal to said gate terminal of said transmission gate.

13. A semiconductor circuit, comprising:

a first terminal and a second terminal for respectively receiving first and second selectively applied power source potentials;

a first power system element group coupled to said first terminal, said first group having a first internal circuit for providing a first signal, a second power system element group coupled to said second terminal, said second group having at least one internal circuit element responsive to said first signal for changing between a first and a second operative state, wherein said at least one internal circuit element is susceptible to an undesirable through current which temporarily lowers the second power source potential when said first selectively applied power source potential is lowered or turned off; and means arranged in said second power system element group and coupled between said first internal circuit of said first group and said at least one circuit element of said second group, for minimizing said undesirable through currents in said at least one circuit element, wherein said means for minimizing said undesirable through currents comprises:

an interface means including a clock gate circuit responsive to a gate control signal and to said first signal for providing an output, and a latch connected in series with the output of said clock gate circuit.

14. The semiconductor circuit of claim 13, wherein said clock circuit comprises two p-channel FETs and two n-channel FETs connected in this order in series between said second terminal and ground, the junction between one of said p-channel FETs and one of said n-channel FETs forming an output node; and wherein said latch is responsive to a voltage of said output node.

* * * * *